(12) United States Patent
Lee et al.

(10) Patent No.: US 11,171,628 B2
(45) Date of Patent: Nov. 9, 2021

(54) ACOUSTIC RESONATOR AND METHOD FOR MANUFACTURING THE SAME

(71) Applicant: Samsung Electro-Mechanics Co., Ltd., Suwon-si (KR)

(72) Inventors: Tae Kyung Lee, Suwon-si (KR); Sung Sun Kim, Suwon-si (KR); Sang Kee Yoon, Suwon-si (KR); Chang Hyun Lim, Suwon-si (KR); Jin Suk Son, Suwon-si (KR); Ran Hee Shin, Suwon-si (KR); Je Hong Kyoung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 789 days.

(21) Appl. No.: 15/972,694

(22) Filed: May 7, 2018

(65) Prior Publication Data

US 2019/0013792 A1    Jan. 10, 2019

(30) Foreign Application Priority Data

Jul. 4, 2017 (KR) .................. 10-2017-0085013
Sep. 6, 2017 (KR) .................. 10-2017-0113819

(51) Int. Cl.
| | |
|---|---|
| *H03H 9/17* | (2006.01) |
| *H03H 9/13* | (2006.01) |
| *H01L 41/047* | (2006.01) |
| *H01L 41/314* | (2013.01) |
| *H01L 41/29* | (2013.01) |
| *H03H 3/02* | (2006.01) |
| *H03H 9/02* | (2006.01) |
| *H03H 9/05* | (2006.01) |

(52) U.S. Cl.
CPC ......... *H03H 9/172* (2013.01); *H01L 41/0477* (2013.01); *H01L 41/29* (2013.01); *H01L 41/314* (2013.01); *H03H 3/02* (2013.01); *H03H 9/02118* (2013.01); *H03H 9/13* (2013.01); *H03H 9/173* (2013.01); *H03H 9/176* (2013.01); *H03H 9/0504* (2013.01); *H03H 2003/021* (2013.01)

(58) Field of Classification Search
CPC ...... H03H 9/172; H03H 9/176; H03H 9/0504; H01L 41/0477; H01L 41/29
See application file for complete search history.

(56) References Cited

U.S. PATENT DOCUMENTS

2010/0117762 A1   5/2010  Taniguchi et al.
2011/0084779 A1*  4/2011  Zhang .................. H03H 9/584
                                                    333/187

(Continued)

FOREIGN PATENT DOCUMENTS

| JP | 5322597 B2 | 10/2013 |
|---|---|---|
| JP | 2015-99988 A | 5/2015 |
| KR | 10-2005-0000923 A | 1/2005 |

*Primary Examiner* — Bryan P Gordon
(74) *Attorney, Agent, or Firm* — NSIP Law

(57) ABSTRACT

An acoustic resonator includes a substrate, a center portion, an extending portion, and a barrier layer. A first electrode, a piezoelectric layer, and a second electrode are sequentially stacked on the substrate in the central portion. The extending portion is configured to extend from the center portion, and includes an insertion layer disposed below the piezoelectric layer. The barrier layer is disposed between the first electrode and the piezoelectric layer.

17 Claims, 6 Drawing Sheets

(56) References Cited

U.S. PATENT DOCUMENTS

| | | | |
|---|---|---|---|
| 2015/0137908 A1* | 5/2015 | Nishihara | H03H 9/02834 |
| | | | 333/133 |
| 2015/0207490 A1* | 7/2015 | Taniguchi | H03H 9/568 |
| | | | 333/133 |
| 2017/0373665 A1* | 12/2017 | Lee | H03H 9/173 |
| 2018/0219528 A1* | 8/2018 | Liu | H03H 9/131 |

* cited by examiner

I-I'

III-III'

_(1)_
ACOUSTIC RESONATOR AND METHOD FOR MANUFACTURING THE SAME

CROSS-REFERENCE TO RELATED APPLICATION(S)

This application claims benefit under 35 USC 119(a) of Korean Patent Application Nos. 10-2017-0085013 filed on Jul. 4, 2017 and 10-2017-0113819 filed on Sep. 6, 2017 in the Korean Intellectual Property Office, the entire disclosure of which is incorporated herein by reference for all purposes.

BACKGROUND

1. Field

The following description relates to an acoustic resonator and a method for manufacturing the same.

2. Description of Related Art

The miniaturization of radio frequency component technology has been necessary due to a trend of miniaturizing wireless communications devices. An example of a miniaturized radio frequency component technology may include a filter implemented as a bulk acoustic wave (BAW) resonator manufactured using a semiconductor thin film wafer.

The bulk acoustic wave (BAW) resonator is a thin film type element implemented as a filter, where the thin film type element induces resonance utilizing piezoelectric characteristics of deposited piezoelectric dielectric material on a silicon wafer, a semiconductor substrate.

Application fields of bulk acoustic wave (BAW) resonators include small and lightweight filters of mobile communications devices, chemical and biological devices, oscillators, resonance elements, acoustic resonance mass sensors, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes a substrate, a center portion, an extending portion, and a barrier layer. A first electrode, a piezoelectric layer, and a second electrode are sequentially stacked on the substrate in the central portion. The extending portion is configured to extend from the center portion, and includes an insertion layer disposed below the piezoelectric layer. The barrier layer is disposed between the first electrode and the piezoelectric layer.

The barrier layer may be disposed between the first electrode and the insertion layer in the extending portion.

The barrier layer may be formed of a dielectric having a hexagonal close-packed (HCP) structure or a metal.

The barrier layer may be formed of titanium (Ti).

The first electrode may be formed of molybdenum (Mo), and the piezoelectric layer may be formed of aluminum nitride (AlN).

The barrier layer may be formed of aluminum nitride (AlN).

The barrier layer and the piezoelectric layer may be formed of a same material.

The barrier layer may have a thickness smaller than a thickness of either the piezoelectric layer or the first electrode.

The piezoelectric layer may include a piezoelectric portion disposed in the center portion and a bending portion disposed in the extending portion. The bending portion may be configured to extend in an incline from the piezoelectric portion along a contour of the insertion layer.

At least a portion of the second electrode may be disposed in the extending portion.

In another general aspect, a method for manufacturing an acoustic resonator, the method comprising: forming a first electrode on a substrate; forming a barrier layer on the first electrode; forming an insertion layer on a portion of the barrier layer; forming a piezoelectric layer comprising a piezoelectric portion and a bending portion; and forming a second electrode on the piezoelectric layer. The piezoelectric portion is stacked on the barrier layer and the bending portion is stacked on the insertion layer.

The barrier layer is formed of a dielectric having a hexagonal close-packed (HCP) structure or a metal.

The barrier layer may be formed of titanium (Ti) or aluminum nitride (AlN).

The first electrode may be formed of molybdenum (Mo), and the piezoelectric layer may be formed of aluminum nitride (AlN).

In another general aspect, acoustic resonator includes a first electrode disposed on a substrate, a piezoelectric layer, a second electrode, an insertion layer, and a barrier layer. The piezoelectric layer is disposed on a portion of the first electrode, and includes a bending portion extending from a piezoelectric portion. The second electrode is disposed on a portion of the piezoelectric layer. The insertion layer is disposed below the bending portion. The barrier layer is disposed between the first electrode and the piezoelectric layer.

A lower surface of the bending portion and an upper surface of the insertion layer may have a same contour.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
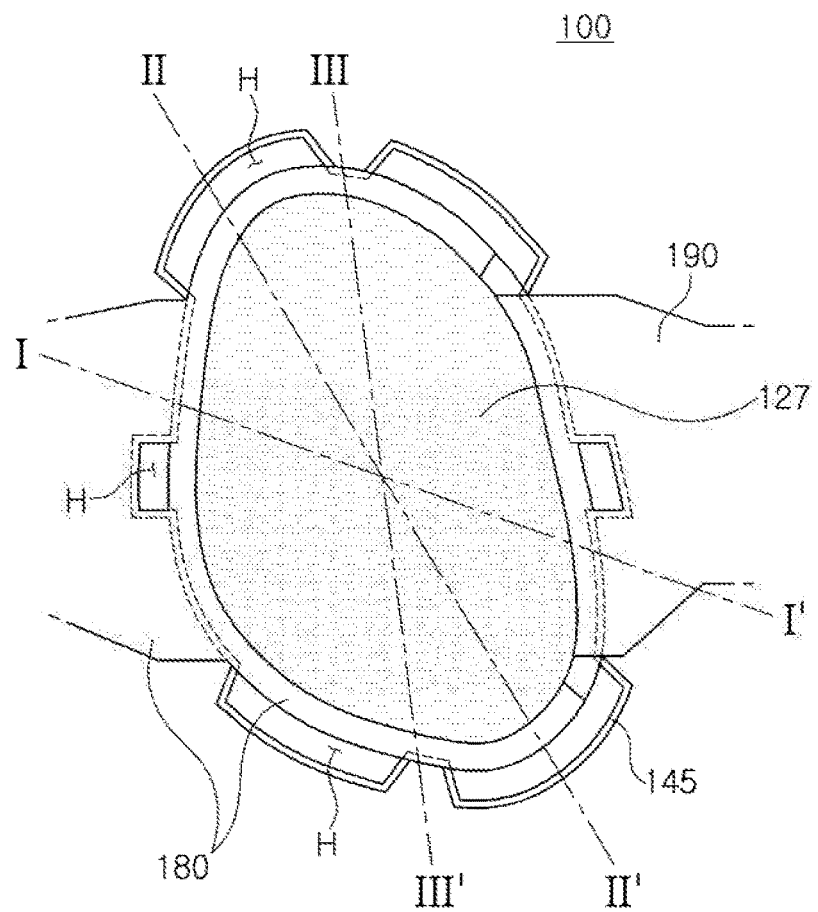
FIG. 1 is a plan view of an example of an acoustic resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
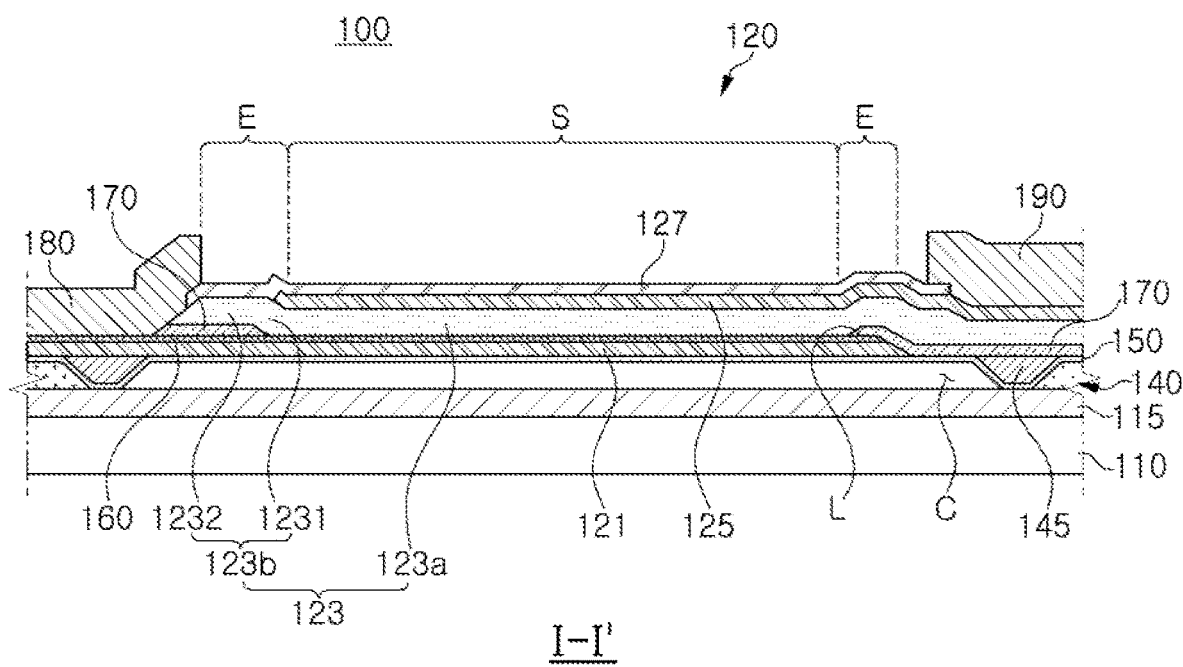
FIG. 2 is a cross-sectional view taken along a line I-I' of FIG. 1.
Figure 3:
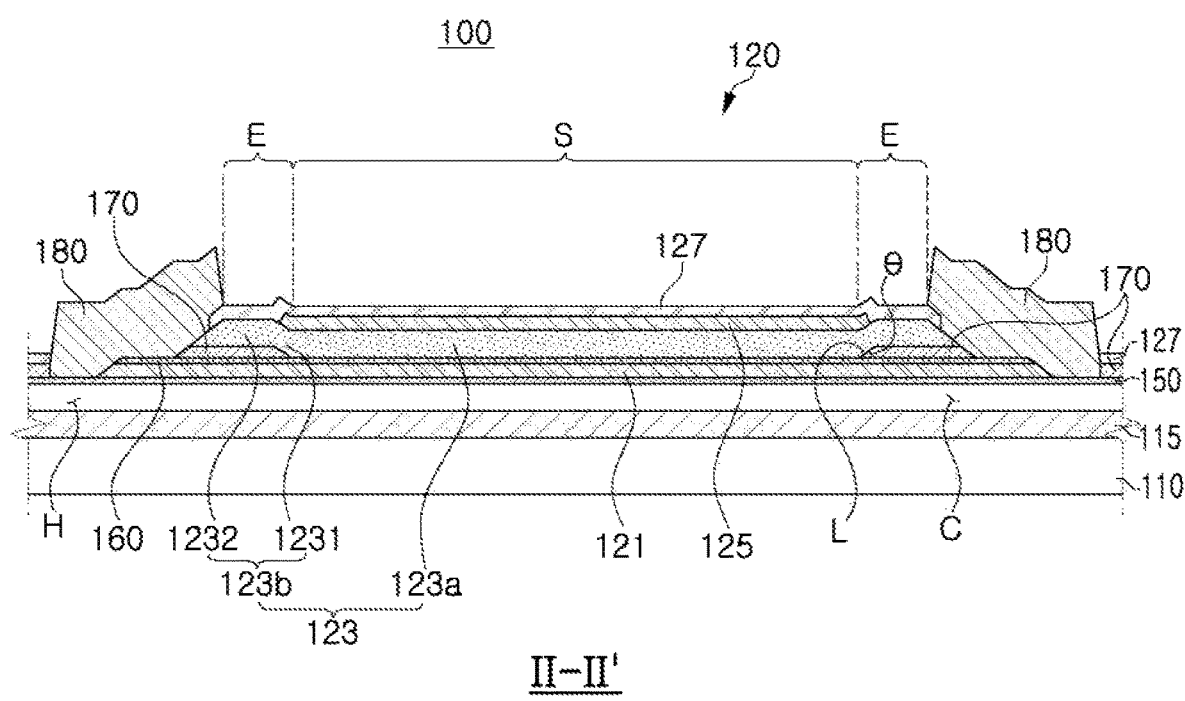
FIG. 3 is a cross-sectional view taken along a line II-II' of FIG. 1.
Figure 4:
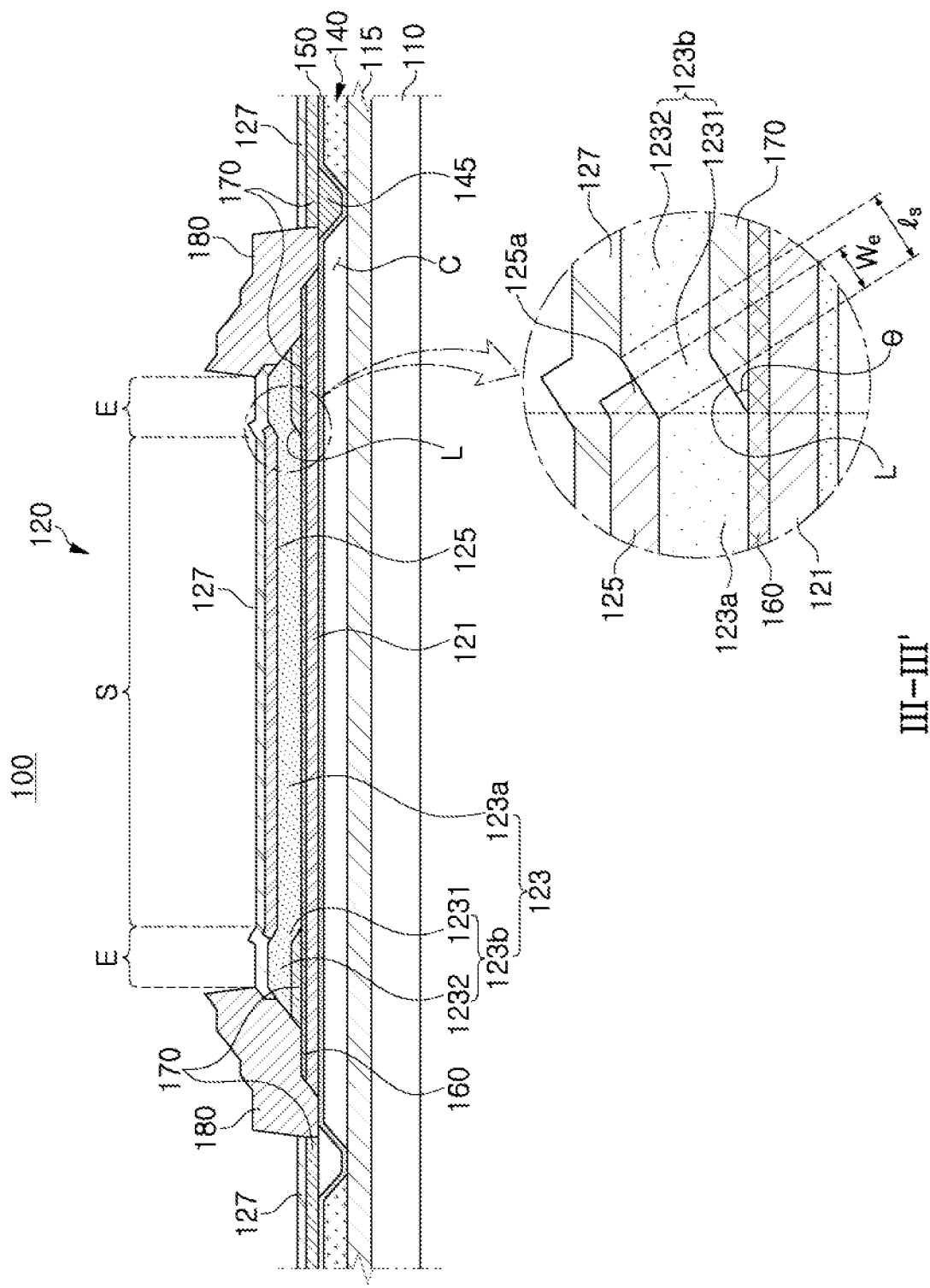
FIG. 4 is a cross-sectional view taken along a line III-III' of FIG. 1.

FIG. 1 is a plan view of an example of an acoustic resonator in the present disclosure and FIG. 2 is a cross-sectional view taken along a line I-I' of FIG. 1. In addition, FIG. 3 is a cross-sectional view taken along a line II-II' of FIG. 1 and FIG. 4 is a cross-sectional view taken along a line III-III' of FIG. 1.

Referring to FIGS. 1 through 4, an acoustic resonator 100 of the present disclosure may be a bulk acoustic wave resonator (BAW), and may include a substrate 110, a sacrificial layer 140, a resonating part 120, an insertion layer 170, and a barrier layer 160.

The substrate 110 may be a silicon substrate, e.g., a silicon wafer or a silicon on insulator (SOI) type of substrate may be used.

An insulating layer 115 may be formed on an upper surface of the substrate 110 to electrically isolate the substrate 110 and the resonating part 120 from each other. In addition, the insulating layer 115 may prevent the substrate 110 from being etched, for example, by etching gas when a cavity C is formed during the process of manufacturing of the acoustic resonator.

In this case, the insulating layer 115 may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 110 by any one process of chemical vapor deposition, RF magnetron sputtering, and evaporation.

The sacrificial layer 140 may be formed on the insulating layer 115, and the cavity C and an etching stop part 145 may be disposed in the sacrificial layer 140.

The cavity C may be formed as an empty space and may be formed by removing a portion of the sacrificial layer 140.

As the cavity C is formed in the sacrificial layer 140, the resonating part 120 formed on the sacrificial layer 140 may be generally flat.

The etching stop part 145 may be disposed along a boundary of the cavity C. The etching stop part 140 may be provided to prevent the cavity C from being etched beyond a cavity region in the process of forming the cavity C. Therefore, a horizontal area of the cavity C may be defined by the etching stop part 145 and a vertical area (e.g., a height) thereof may be defined by a thickness of the sacrificial layer 140.

A membrane layer 150 may be formed on the sacrificial layer 140 to define a thickness (or a height) of the cavity C together with the substrate 110. Therefore, the membrane layer 150 may also be formed of a material not easily removed in the process of forming the cavity C.

For example, in a case in which halide-based etching gases such as fluorine (F), chlorine (Cl), and the like are used to remove a portion (e.g., a cavity region) of the sacrificial layer 140, the membrane layer 150 may be formed of a material having low reactivity with the above-mentioned etching gases. In this case, for example, the membrane layer 150 may include either one or both of silicon dioxide ($SiO_2$) and silicon nitride ($Si_3N_4$).

In addition, the membrane layer 150 may be formed of a dielectric layer containing any one or any combination of any two or more manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or may be formed of a metal layer containing any one or any two or more combination of aluminum (Al), nickel (Ni), chromium (Cr), platinum (Pt), gallium (Ga), and hafnium (Hf). However, the configuration of the present disclosure is not limited thereto.

A seed layer (not shown) formed of aluminum nitride (AlN) may be formed on the membrane layer 150. Specifically, the seed layer may be disposed between the membrane layer 150 and a first electrode 121. The seed layer may be formed of a dielectric having a hexagonal close-packed (HCP) structure or a metal other than AlN. In a case in which the seed layer is formed of the metal, the seed layer may be formed of, for example, titanium (Ti).

The resonating part 120 may include a first electrode 121, a piezoelectric layer 123, and a second electrode 125. The resonating part 120 may be formed by upwardly stacking the first electrode 121, the piezoelectric layer 123, and the second electrode 125 in this order. Therefore, in the resonating part 120, the piezoelectric layer 123 may be disposed between the first electrode 121 and the second electrode 125.

Since the resonating part 120 is formed on the membrane layer 150, the resonating part 120 may be formed by sequentially stacking the membrane layer 150, the first electrode 121, the piezoelectric layer 123, and the second electrode 125 on the substrate 110.

The resonating part 120 may allow the piezoelectric layer 123 to resonate in response to signals applied to the first electrode 121 and the second electrode 125 to generate a resonance frequency and an anti-resonance frequency.

The resonating part 120 may be classified into a center portion S on which the first electrode 121, the piezoelectric layer 123, and the second electrode 125 are stacked to be substantially flat, and an extending portion E in which the insertion layer 170 is interposed between the first electrode 121 and the piezoelectric layer 123.

The center portion S may be a region disposed at the center of the resonating part 120 and the extending portion E may be a region disposed along a circumference of the center portion S. Therefore, the extending portion E refers to a region extending externally from the center portion S.

The insertion layer 170 may include an inclined surface L that a thickness thereof is increased as a distance from the center portion S is increased.

In the extending portion E, the piezoelectric layer 123 and the second electrode 125 may be disposed on the insertion layer 170. Therefore, the piezoelectric layer 123 and the second electrode 125 disposed in the extending portion E may include inclined surfaces formed along the inclined surface L of the insertion layer 170.

In the present example, the extending portion E is included in the resonating part 120. Accordingly, resonance may also occur in the extending portion E. However, the occurrence of resonance is not limited thereto, and resonance may not occur in the extending portion E depending on the structure of the extending portion E and may also only occur in the center portion S.

The first electrode 121 and the second electrode 125 may be formed of a conductive material, and may be formed of, for example, gold, molybdenum, ruthenium, iridium, aluminum, platinum, titanium, tungsten, palladium, tantalum, chromium, nickel, or alloys including at least one thereof, but is not limited thereto.

The first electrode 121 may have a wider area than the second electrode 125 and a first metal layer 180 may be disposed on the first electrode 121 along an outer portion of the first electrode 121. Therefore, the first metal layer 180 may be disposed to surround the second electrode 125.

Since the first electrode 121 is disposed on the membrane layer 150, the first electrode 121 may be generally flat. On the other hand, since the second electrode 125 may be disposed on the piezoelectric layer 123, the second electrode 125 may have a curvature corresponding to a shape of the piezoelectric layer 123.

The second electrode 125 may be entirely disposed in the center portion S and may be partially disposed in the extending portion E. Accordingly, the second electrode 125 may be classified into a portion disposed on a piezoelectric portion 123a of the piezoelectric layer 123 and a bending portion 123b of the piezoelectric layer 123, which are to be described below.

More specifically, according to the present example, the second electrode 125 may be disposed to cover the entirety of the piezoelectric portion 123a and a portion of an inclined portion 1231 of the piezoelectric layer 123. Therefore, the second electrode 125a (FIG. 4) disposed in the extending portion E may have a smaller area than an inclined surface of the inclined portion 1231, and the second electrode 125 in the resonating part 120 may have a smaller area than the piezoelectric layer 123.

The piezoelectric layer 123 may be formed on the first electrode 121 and an insertion layer 170 to be described below.

Zinc oxide (ZnO), aluminum nitride (AlN), doped aluminum nitride, lead zirconate titanate, quartz, and the like may be selectively used as a material of the piezoelectric layer 123. The doped aluminum nitride may further include a rare earth metal or a transition metal. As an example, the rare earth metal may include any one or any combination of any two or more of scandium (Sc), erbium (Er), yttrium (Y), and lanthanum (La). The transition metal may include any one or any combination of any two or more of hafnium (Hf), titanium (Ti), zirconium (Zr), tantalum (Ta), niobium (Nb), and magnesium (Mg).

The piezoelectric layer 123 according to the present example may include a piezoelectric portion 123a disposed in the center portion S and a bending portion 123b disposed in the extending portion E.

The piezoelectric portion 123a may be a portion which is directly stacked on an upper surface of the first electrode 121. Therefore, the piezoelectric portion 123a may be interposed between the first electrode 121 and the second electrode 125 to form a flat form together with the first electrode 121 and the second electrode 125.

The bending portion 123b may be defined as a region which is extended externally from the piezoelectric portion 123a and disposed in the extending portion E.

The bending portion 123b may be disposed on the insertion layer 170 to be described below and may be formed to have a profile conforming to a shape of the insertion layer 170. Accordingly, the piezoelectric layer 123 may be bent at a boundary between the piezoelectric portion 123a and the bending portion 123b and the bending portion 123b may be contoured to correspond to a thickness and a shape of the insertion layer 170.

The bending portion 123b may be classified into an inclined portion 1231 and an extending portion 1232.

The inclined portion 1231 refers to a portion formed to be inclined along the inclined surface L of the insertion layer 170 to be described below. In addition, the extending portion 1232 refers to a portion which is extended externally from the inclined portion 1231.

The inclined portion 1231 may be formed to be parallel to the inclined surface L of the insertion layer 170, and an inclined angle of the inclined portion 1231 may be the same as an inclined angle (θ in FIG. 4) of the inclined surface L of the insertion layer 170.

The insertion layer 170 may be disposed along a surface formed by the membrane layer 150, the first electrode 121, and the etching stop part 145.

The insertion layer 170 may be disposed around the center portion S to support the bending portion 123b of the piezoelectric layer 123. Therefore, the bending portion 123b of the piezoelectric layer 123 may be classified into the inclined portion 1231 and the extending portion 1232 depending on the shape of the insertion layer 170.

The insertion layer 170 may be disposed in a region other than the center portion S. For example, the insertion layer 170 may be disposed in a region entirely or partially outside the center portion S.

In addition, at least a portion of the insertion layer 170 may be disposed between the piezoelectric layer 123 and the first electrode 121.

The insertion layer 170 disposed along a boundary of the center portion S may have a side surface that a thickness thereof is increased as a distance from the center portion S is increased. Thereby, the side surface of the insertion layer 170 disposed to be adjacent to the center portion S may be an inclined surface L having a constant inclined angle θ.

In a case in which the inclined angle θ of the side surface of the insertion layer 170 is less than 5°, in order to manufacture the insertion layer 170, since the thickness of the insertion layer 170 needs to be extremely thin or an area of the inclined surface L needs to be excessively large; thus, it may be difficult to substantially implement the insertion layer 170.

In addition, in a case in which the inclined angle θ of the side surface of the insertion layer 170 is greater than 70°, the inclined angle of the inclined portion 1231 of the piezoelectric layer 123 stacked on the insertion layer 170 may also be greater than 70°. In this case, since the piezoelectric layer 123 is excessively bent, a crack may occur in a bent portion of the piezoelectric layer 123.

Therefore, according to the present example, the inclined angle θ of the inclined surface L may have the range of 5° or more to 70° or less.

The insertion layer 170 may be formed of a dielectric such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from the piezoelectric layer 123. In addition, a region in which the insertion layer 170 is formed may also be formed as an empty space, as needed. This empty space may be implemented by forming the entirety of the resonating part 120 and then removing the insertion layer 170 in the manufacturing process.

According to the present example, the thickness of the insertion layer 170 may be the same as or similar to the thickness of the first electrode 121. In addition, the thickness of the insertion layer 170 may be similar to or thinner than the thickness of the piezoelectric layer 123. For example, the insertion layer 170 may have the thickness of 100 Å or more, and may have the thickness lower than the thickness of the piezoelectric layer 123. However, the configuration of the present disclosure is not limited thereto.

In addition, the acoustic resonator according to the present example may have a barrier layer 160 disposed on the first electrode 121. Therefore, the barrier layer 160 may be disposed between the first electrode 121 and the piezoelectric layer 123, and may be disposed between the first electrode 121 and the insertion layer 170 in the extending part E.

Thereby, the insertion layer 170 may be substantially disposed on the barrier layer 160. In addition, the piezoelectric layer 123 may also be disposed on the barrier layer 160 in a portion in which the insertion layer 170 is not present.

In a case in which the barrier layer 160 is not present, the insertion layer 170 may be directly disposed on the first electrode 121. In this case, a process of depositing and patterning the insertion layer 170 on the first electrode 121 in the process of manufacturing the acoustic device may be performed.

However, a portion of the first electrode 121 may be removed by etching gas (e.g., $O_2$, Cl) used in the process of patterning the insertion layer 170. Thereby, a surface roughness of the first electrode 121 positioned at the center portion S may be increased, and this may act as a somewhat unfavorable condition for crystal orientation during the deposition/growth of the piezoelectric layer 123.

Therefore, according to the present example, the barrier layer 160 may be formed of the material of the insertion layer 170 and a material having high dry etch selectivity. In this case, a frequency dispersion due to loss of the first electrode 121 may be improved.

In addition, in a case in which the barrier layer 160 is formed of a material which contributes not only to the crystal orientation with the first electrode 121 but also to the crystal orientation of the piezoelectric layer 123, the crystal orientation of the piezoelectric layer 123 may also be improved due to the improvement of the surface roughness of the first electrode 121.

The barrier layer 160 according to the present example may be formed of aluminum nitride (AlN). However, a material of the barrier layer 160 is not limited thereto, and the barrier layer 160 may be formed of a dielectric having a HCP structure or a metal other than aluminum nitride (AlN). In a case in which the barrier layer 160 is formed of the metal, the barrier layer 160 may be formed of titanium (Ti).

Since the dielectric material having the HCP structure such as aluminum nitride (AlN) is a material which has high dry etch selectivity with the insertion layer 170 and is the same as the piezoelectric layer 123, it may effectively perform a function of the barrier layer 160.

In addition, in a case in which the barrier layer 160 is formed of titanium (Ti), since dry etch selectivity with the insertion layer 170 is excellent and a lattice mismatch between the first electrode 121 and the piezoelectric layer 123 is small, crystal orientation may be improved.

The resonating part 120 according to the present example configured as described above may be spaced apart from the substrate 110 through the cavity C formed as the empty space.

The cavity C may be formed by supplying etching gas (or etching solution) into an injection hole H (FIGS. 1 and 3) to remove a portion of the sacrificial layer 140 in the process of manufacturing the acoustic resonator.

The protective layer 127 may be disposed along a surface of the acoustic resonator 100 to externally protect the acoustic resonator 100. The protective layer 127 may be disposed along a surface formed by the second electrode 125, the bending portion 123b of the piezoelectric layer 123, and the insertion layer 170.

The protective layer 127 may be formed of any one insulating material of silicon oxide based insulating material, silicon nitride based insulating material, aluminum oxide based insulating material, and aluminum nitride based insulating material, but is not limited thereto.

As illustrated in FIG. 2, the first electrode 121 and the second electrode 125 may be extended externally from the resonating part 120, and a first metal layer 180 and a second metal layer 190 may be disposed on upper surfaces of the extended portions of the first electrode 121 and the second electrode 125, respectively.

The first metal layer 180 and the second metal layer 190 may be formed of a material such as gold (Au), a gold-tin (Au—Sn) alloy, copper (Cu), a copper-tin (Cu—Sn) alloy, and the like.

The first metal layer 180 and the second metal layer 190 may serve as connection wirings that electrically connect the electrodes 121 and 125 of the acoustic resonator according to the present example with electrodes of another acoustic resonator disposed to be adjacent to the acoustic resonator, or may serve as external connection terminals. However, the function of the first metal layer 180 and the second metal layer 190 is not limited thereto.

Even though FIG. 2 illustrates a case in which the insertion layer 170 is disposed below the second metal layer 190, the configuration of the present disclosure is not limited thereto and the acoustic resonator may also be implemented in a structure in which the insertion layer 170 is removed below the second metal layer 190, as needed.

The first metal layer 180 may penetrate through the insertion layer 170 and the protective layer 127 to be coupled to the first electrode 121.

In addition, as illustrated in FIG. 3, the first electrode 121 may have a wider area than the second electrode 125, and the first metal layer 180 may be formed around the first electrode 121.

Therefore, the first metal layer 180 may be disposed along a circumference of the resonating part 120 and disposed to surround the second electrode 125 accordingly. However, the arrangement of the first metal layer 180 is not limited thereto.

Meanwhile, as described above, the second electrode 125 according to the present example may be disposed to be stacked on the piezoelectric portion 123a and the inclined portion 1231 of the piezoelectric layer 123. In addition, a portion 125a (FIG. 4) of the second electrode 125 disposed on the inclined portion 1231 of the piezoelectric layer 123, that is, the second electrode 125a disposed on the extending portion E may be disposed only on a portion of an inclined surface of the inclined portion 1231, not the entirety of the inclined surface thereof.

Figure 9:
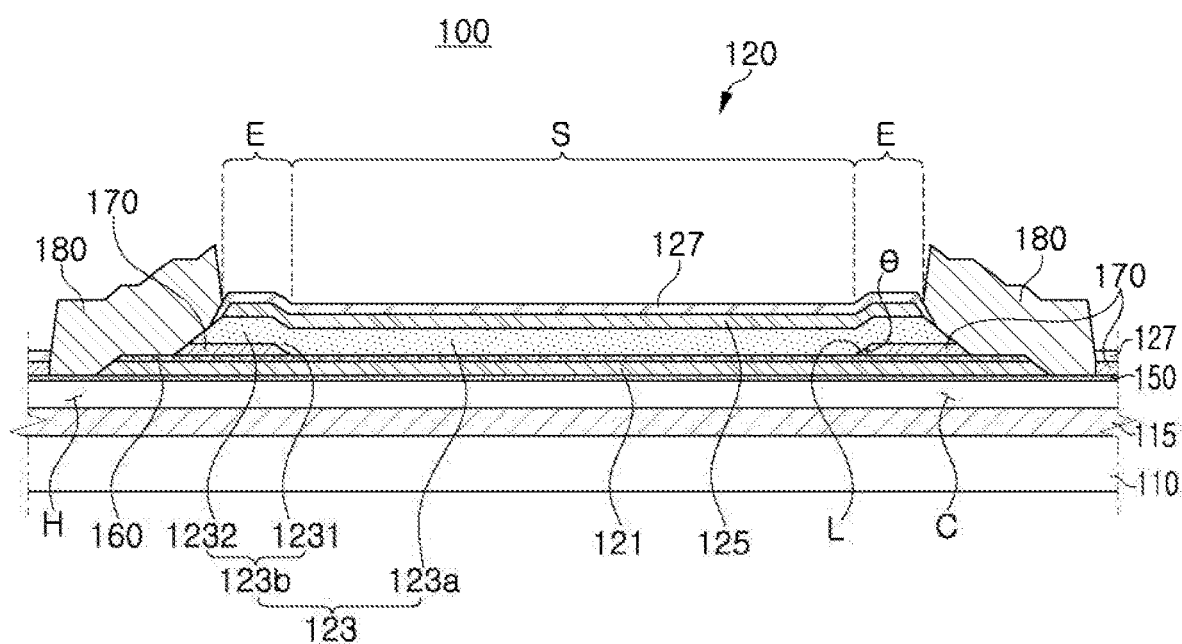
FIG. 9 is a cross-sectional view of another example of an acoustic resonator.

However, the configuration of the present disclosure is not limited thereto and may be variously modified. For example, the second electrode 125 may be disposed on the entirety of the piezoelectric portion 123a and the inclined part 1231 of the piezoelectric layer 123, or as illustrated in FIG. 9, the second electrode 125 may be disposed on the entirety of the center portion S and the extending portion E.

In the acoustic resonator according to the present example configured as described above, since the extending portion E of the resonating part 120 has a thickness thicker than the center portion S due to the insertion layer 170, Q-factor of the acoustic resonator may be increased by suppressing vibration generated in the center portion S from escaping to the outer portion of the center portion S.

In addition, the second electrode 125 may be partially disposed in the extending portion E, thereby providing remarkably improved resonance performance.

In addition, since the insertion layer 170 is disposed on the barrier layer 160, the frequency dispersion caused due to loss of a portion of the first electrode 121 in the manufacturing process may be improved, and since the surface roughness of the first electrode may be improved, crystal orientation of the piezoelectric layer 123 may also be improved.

In addition, in a case in which the barrier layer 160 is formed of a specific material, the lattice mismatch with AlN, which is the piezoelectric layer 123, may be improved, such that the crystal orientation of the piezoelectric layer 123 may be further improved.

For example, referring to Table 1, in a case in which the barrier layer 160 is formed of titanium (Ti) and the piezoelectric layer 123 is formed of aluminum nitride (AlN), the lattice mismatch between the barrier layer 160 and the piezoelectric layer 123 may be about 6%. On the other hand, in a case in which the piezoelectric layer 123 is directly formed on the first electrode 121 formed of molybdenum without the barrier layer 160, the lattice mismatch between molybdenum (Mo) and aluminum nitride (AlN) may be 13%. Therefore, when the barrier layer 160 is disposed between the first electrode 121 and the piezoelectric layer 123, it may be seen that the lattice mismatch is improved.

TABLE 1

| Classification | Material | Material of Piezoelectric Layer | Lattice Mismatch, % |
|---|---|---|---|
| Barrier Layer | Ti (0002) | AlN (0002) | 6 |
| First Electrode | Mo (110) | AlN (0002) | 13 |

In addition, when the barrier layer 160 is formed of titanium (Ti) as in the present example, the crystal orientation of the piezoelectric layer 123 may be improved.

In order to confirm an effect of the present disclosure, the barrier layer 160 formed of titanium (Ti) was deposited on the first electrode 121 formed of molybdenum (Mo) at a thickness of 500 Å, a difference in crystal orientation with a conventional structure was compared.

Referring to the following Table 2, a comparative example illustrates a structure to which the barrier layer is not applied, where the insertion layer 170 was directly deposited/patterned on the first electrode 121. Thereby, the piezoelectric layer 123 was deposited at a thickness of 1 μm on a surface of the first electrode 121 which is partially lost and roughened.

Thereafter, molybdenum (Mo) was deposited at a thickness of 3000 Å on the second electrode 135 to form a capacitor having a predetermined area, and a leakage current was then measured.

The leakage current was measured by applying voltages of 100V, 150V, and 200V to the first and second electrodes 121 and 125, and crystal orientation of the piezoelectric layer 123 was compared based on the measured leakage current. When the crystal orientation of the piezoelectric layer is improved, a dielectric loss value is decreased and a leakage current value represents a low value.

TABLE 2

| | Comparative Example | Inventive Example |
|---|---|---|
| Leakage current (nA) | | |
| 100 V | 23.54 | 20.97 |
| 150 V | 222.69 | 204 |
| 200 V | 1513.25 | 1389.26 |
| Rocking curve (0002) | | |
| FWHM (degree) | 1.321 | 1.304 |

In addition, the crystal orientation of AlN (0002) crystal surfaces was compared by measuring a rocking curve of X-ray diffraction (XRD).

In the case in which the barrier layer 160 is applied, it may be confirmed that the leakage current is lower than the conventional structure when the voltages of 100V, 150V, and 200V are applied, and it may be confirmed from a measurement result of the rocking curve of XRD that the crystal orientation of AlN crystal surface is improved by 0.02 degree.

It may be seen from the above experiment result that an increase in the surface roughness of the first electrode 121 formed of molybdenum (Mo) may be suppressed during the deposition/patterning of the insertion layer 170 when the barrier layer 160 formed of the titanium (Ti) material is applied, and a lattice parameter mismatch between Ti/AlN is improved to improve the crystal orientation of the piezoelectric layer 123 formed of aluminum nitride (AlN).

Next, a method for manufacturing an acoustic resonator according to the present example will be described.

FIGS. 5 through 8 are views illustrating an example of a method for manufacturing an acoustic resonator.

Figure 5:
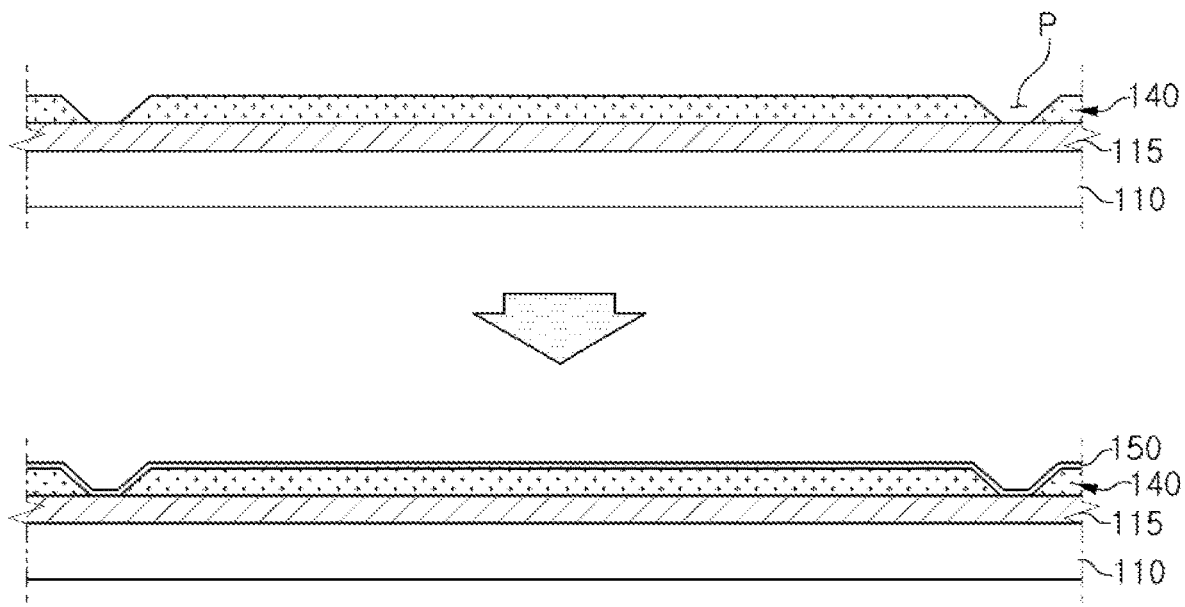
FIGS. 5 through 8 are views illustrating an example of a method for manufacturing an acoustic resonator.

Referring first to FIG. 5, in the method for manufacturing an acoustic resonator, an insulating layer 115 and a sacrificial layer 140 may be first formed on a substrate 110, and a pattern P penetrating through the sacrificial layer 140 may be formed. Therefore, the insulating layer 115 may be externally exposed through the pattern P.

The insulating layer 115 may be formed of manganese oxide (MgO), zirconium oxide (ZrO$_2$), aluminum nitride (AlN), lead zirconate titanate (PZT), gallium arsenic (GaAs), hafnium oxide (HfO$_2$), aluminum oxide (Al$_2$O$_3$), titanium oxide (TiO$_2$), zinc oxide (ZnO), silicon nitride (SiN), silicon oxide (SiO$_2$), or the like, but a material of the insulating layer 115 is not limited thereto.

The pattern P formed in the sacrificial layer 140 may have a cross section of a trapezoidal shape in which a width of an upper surface thereof is greater than a width of a lower surface thereof.

The sacrificial layer 140 may be partially removed by a subsequent etching process to form a cavity C (FIG. 2). The sacrificial layer 140 may be formed of a material such as polysilicon, polymer, or the like which may be easily etched. However, the material of the sacrificial layer 140 is not limited thereto.

Next, a membrane layer 150 may be formed on the sacrificial layer 140. The membrane layer 150 may have a constant thickness along a surface of the sacrificial layer 140. The thickness of the membrane layer 150 may be thinner than that of the sacrificial layer 140.

The membrane layer 150 may include at least one of silicon dioxide (SiO$_2$) and silicon nitride (Si$_3$N$_4$). In addition, the membrane layer 150 may be formed of a dielectric layer containing any one or any combination of any two or more material of manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), or a metal layer containing any one or any combination of any two or more material of aluminum (Al), nickel (Ni), chromium (Cr), platinum (Pt), gallium (Ga), and hafnium (Hf). However, the configuration of the present disclosure is not limited thereto.

Meanwhile, although not illustrated, a seed layer may be formed on the membrane layer 150.

The seed layer may be disposed between the membrane layer 150 and a first electrode 121 to be described below. The seed layer may be formed of aluminum nitride (AlN), but is not limited thereto, and may also be formed of a dielectric having an HCP structure or a metal. For example, in a case in which the seed layer is formed of the metal, the seed layer may be formed of titanium (Ti).

Figure 6:
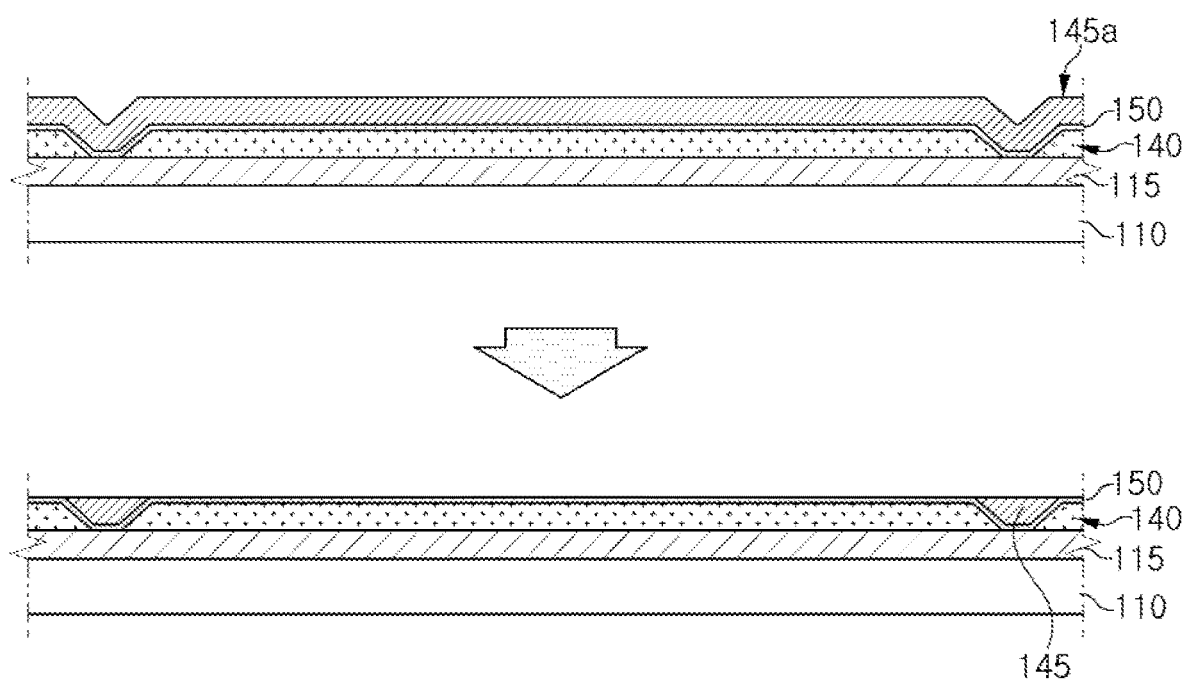

Next, as illustrated in FIG. 6, an etching stop layer 145a may be formed on the membrane layer 150. The etching stop layer 145a may also be filled in the pattern P.

The etching stop layer 145a may have a thickness that completely fills the pattern P (see FIG. 5). Therefore, the etching stop layer 145a may have a thickness thicker than the sacrificial layer 140.

The etching stop layer 145a may be formed of the same material as the insulating layer 115, but is not limited thereto.

Next, the etching stop layer 145a may be removed so that the membrane layer 150 is externally exposed.

Here, a portion of the etching stop layer 145a filled in the pattern P may remain, and the remaining etching stop layer 145a may serve as an etching stop part 145.

Figure 7:
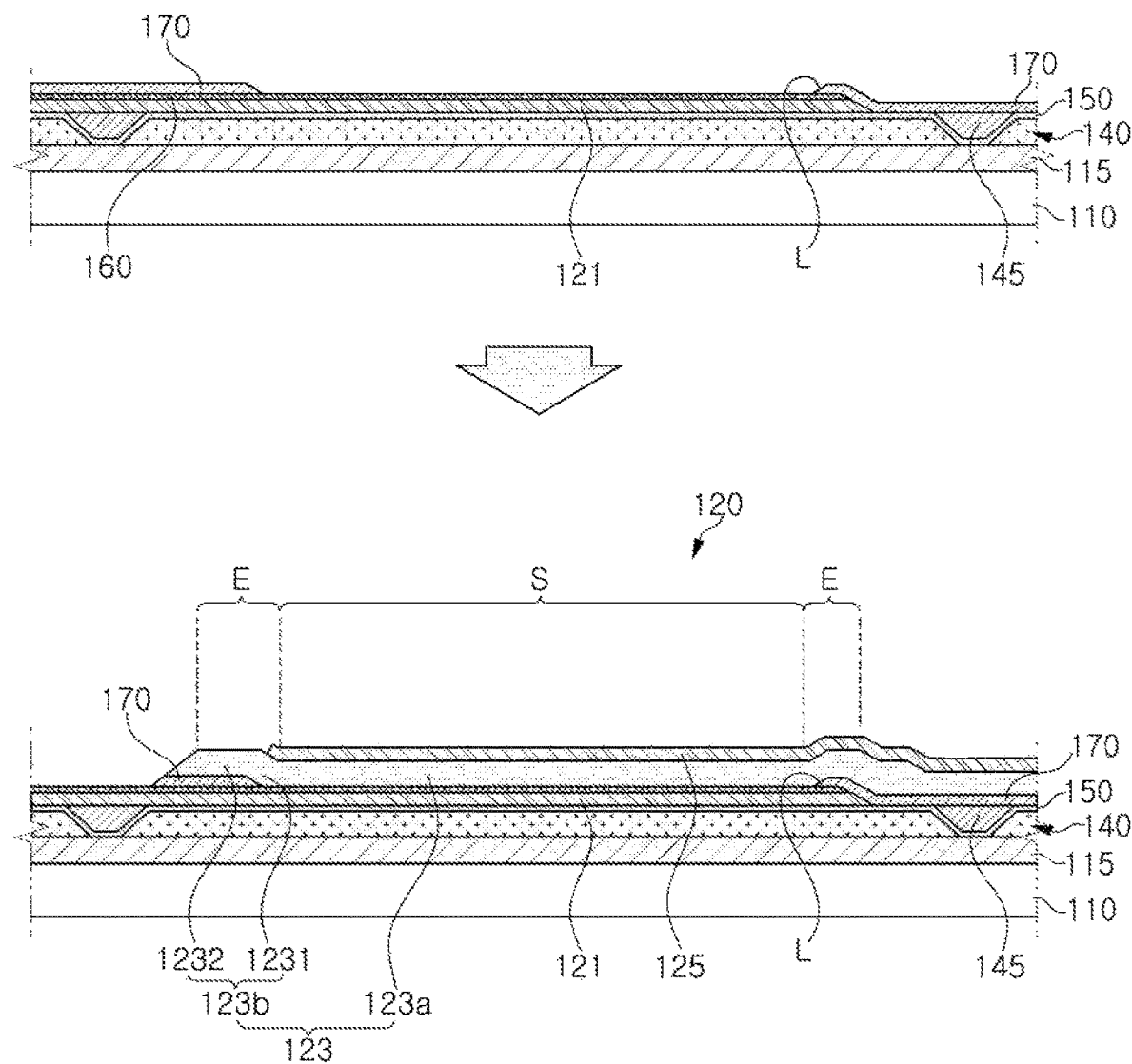

Next, as illustrated in FIG. 7, a first electrode 121 may be formed on an upper surface of the membrane layer 150.

According to the present example, the first electrode 121 may be formed of a conductive material that may include any one and any combination of any two or more of gold, molybdenum, ruthenium, iridium, aluminum, platinum, titanium, tungsten, palladium, tantalum, chromium, nickel, or alloys including at least one thereof, but is not limited thereto.

The first electrode 121 may be formed on a region in which a cavity C (FIG. 3) is to be formed.

The first electrode 121 may be formed by forming a conductor layer to cover the entirety of the membrane layer 150 and then removing an unnecessary portion. In this process, the barrier layer 160 may be removed together.

The barrier layer 160 may be formed on the first electrode 121 and may be formed of, for example, aluminum nitride (AlN). However, a material of the barrier layer 160 is not limited thereto and may also be formed of a dielectric having an HCP structure or a metal. For example, in a case in which the barrier layer 160 is formed of the metal, the barrier layer 160 may be formed of titanium (Ti).

The barrier layer 160 may be formed on the conductor layer before completing the first electrode 121, and an unnecessary portion of the barrier layer 160 may also be then removed together in the process of removing the unnecessary portion of the first electrode 121. Accordingly, the barrier layer 160 may be disposed only on an upper surface of the first electrode 121. However, the formation of the barrier 160 is not limited thereto and may be variously modified. For example, the barrier layer 160 may be formed on the first electrode 121 after completing the first electrode 121.

Next, an insertion layer 170 may be formed. The insertion layer 170 may be formed on the first electrode 121 and the barrier layer 160 and may be extended upwardly from the membrane layer 150 as needed.

The insertion layer 170 may be completed by performing a deposition to cover the entirety of a surface formed by the membrane layer 150, the first electrode 121, the barrier layer 160, and the etching stop layer 145 and performing a patterning process of removing a portion disposed on a region corresponding to a center portion S.

Accordingly, a central portion of the first electrode 121 configuring the center portion S may be exposed externally from the insertion layer 170. In addition, the insertion layer 170 may cover a portion of the first electrode 121 along a circumference of the first electrode 121. Therefore, an edge portion of the first electrode 121 disposed on the extending portion E may be disposed below the insertion layer 170.

A side surface of the insertion layer 170 disposed to be adjacent to the center portion S may be formed as an inclined surface L. The insertion layer 170 may have a thinner thickness toward the center portion S, and as a result, a lower surface of the insertion layer 170 may further extend toward the center portion S than an upper surface of the insertion layer 170. Here, an inclined angle of the inclined surface L of the insertion layer 170 may have the range of 5° to 70° as described above.

The insertion layer 170 may be formed of any one and any combination of any two or more of a dielectric such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from the piezoelectric layer 123.

Next, a piezoelectric layer 123 may be formed on the first electrode 121 and the insertion layer 170.

According to the present example, the piezoelectric layer 123 may be formed of aluminum nitride (AlN). However, the material of the piezoelectric layer 123 is not limited thereto and may include any one and any combination of any two or more of piezoelectric layer 123, zinc oxide (ZnO), doped aluminum nitride, lead zirconate titanate, quartz, and the like. In addition, the doped aluminum nitride may further include a rare earth metal or a transition metal. As an example, the rare earth metal may include any one or any combination of any two or more of scandium (Sc), erbium (Er), yttrium (Y), and lanthanum (La). The transition metal may include any one or any combination of any two or more of hafnium (Hf), titanium (Ti), zirconium (Zr), and tantalum (Ta), niobium (Nb), and magnesium (Mg).

In addition, the piezoelectric layer 123 may be formed of a material different from the insertion layer 170.

The piezoelectric layer 123 may be formed by forming a piezoelectric material on the entirety of a surface formed by the first electrode 121, the barrier layer 160, and the insertion layer 170 and then partially removing an unnecessary portion of the piezoelectric material. According to the present example, the piezoelectric layer 123 may be completed by forming the second electrode 125 and then removing an unnecessary portion of the piezoelectric material. However, the formation of the piezoelectric layer 123 is not limited thereto, and may be completed before the second electrode 125 is formed.

The piezoelectric layer 123 may partially cover the first electrode 121 and the insertion layer 170, and as a result, the piezoelectric layer 123 may be formed along a shape of a surface formed by the first electrode 121 and the insertion layer 170.

As described above, a portion of the first electrode 121 corresponding to the center portion S may be externally exposed outside of the insertion layer 170. Therefore, the piezoelectric layer 123 formed on the barrier layer 160 of the first electrode 121 may be disposed in the center portion S. In addition, a bending portion 123b formed on the insertion layer 170 may be disposed in the extending portion E.

Next, a second electrode 125 may be formed on the piezoelectric layer 123. According to the present example, the second electrode 125 may be formed of a conductive material that includes any one and any combination of any two or more of gold, molybdenum, ruthenium, iridium, aluminum, platinum, titanium, tungsten, palladium, tantalum, chromium, nickel, or alloys including at least one thereof, but is not limited thereto.

The second electrode 125 may be formed on the piezoelectric portion 123a of the piezoelectric layer 123. As described above, the piezoelectric portion 123a of the piezoelectric layer 123 may be disposed in the center portion S. Therefore, the second electrode 125 disposed on the piezoelectric layer 123 may also be disposed in the center portion S.

In addition, according to the present example, the second electrode 125 may also be formed on an inclined portion 1231 of the piezoelectric layer 123. Accordingly, as described above, the second electrode 125 may be partially disposed in the entirety of the center portion S and the extending portion E.

Figure 8:
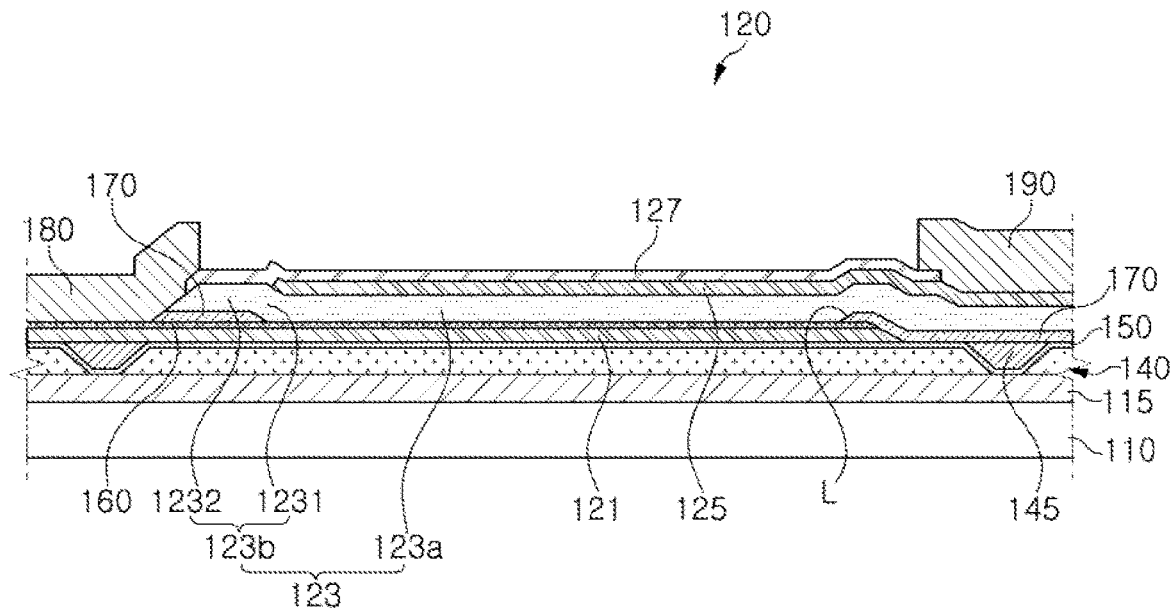

Next, as illustrated in FIG. 8, a protective layer 127 may be formed.

The protective layer 127 may be formed along a surface formed by the second electrode 125 and the piezoelectric layer 123. In addition, although not illustrated, the protective layer 127 may also be formed on the insertion layer 170 which is externally exposed.

The protective layer 127 may be formed of one insulating material of silicon oxide based insulating material, silicon nitride based insulating material, aluminum oxide based insulating material, and aluminum nitride based insulating material, but is not limited thereto.

Next, the first electrode 121 and the second electrode 125 may be partially exposed by partially removing the protective layer 127 and the piezoelectric layer 123, and a first metal layer 180 and a second metal layer 190 may be formed on the exposed portions of the first and second electrodes, respectively.

The first metal layer 180 and the second metal layer 190 may be formed of materials such as gold (Au), a gold-tin (Au—Sn) alloy, copper (Cu), a copper-tin (Cu—Sn) alloy, and the like, and may be formed to be deposited on the first electrode 121 or the second electrode 125, but are not limited thereto.

Next, a cavity C may be formed.

The cavity C may be formed by removing a portion disposed in the etching stop portion 145 in the sacrificial layer 140. As a result, the acoustic resonator 100 illustrated in FIGS. 2 and 3 may be completed. The sacrificial layer 140 removed in this process may be removed by an etching method.

In a case in which the sacrificial layer 140 is formed of a material such as polysilicon, polymer, or the like, the sacrificial layer 140 may be removed by a dry etching method using halide-based etching gases (e.g., $XeF_2$) such as fluorine (F), chlorine (Cl), and the like.

As set forth above, according to the examples in the present disclosure, the acoustic resonator may improve frequency dispersion due to loss of the first electrode by disposing the barrier layer on the first electrode. In addition, the crystal orientation of the piezoelectric layer may be improved by suppressing an increase in surface roughness of the first electrode.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
   a substrate;
   a center portion in which a first electrode, a piezoelectric layer, and a second electrode are sequentially stacked on the substrate, wherein the first electrode is disposed between the substrate and the second electrode;
   an extending portion extending from the center portion, and comprising an insertion layer disposed below the piezoelectric layer, the insertion layer being directly laminated on a barrier layer; and
   the barrier layer disposed between the first electrode and the piezoelectric layer.

2. The acoustic resonator of claim 1, wherein the barrier layer is disposed between the first electrode and the insertion layer in the extending portion.

3. The acoustic resonator of claim 1, wherein the barrier layer is formed of a dielectric having a hexagonal close-packed (HCP) structure or a metal.

4. The acoustic resonator of claim 3, wherein the barrier layer is formed of titanium (Ti).

5. The acoustic resonator of claim 4, wherein the first electrode is formed of molybdenum (Mo), and
   the piezoelectric layer is formed of aluminum nitride (AlN).

6. The acoustic resonator of claim 3, wherein the barrier layer is formed of aluminum nitride (AlN).

7. The acoustic resonator of claim 3, wherein the barrier layer and the piezoelectric layer are formed of a same material.

8. The acoustic resonator of claim 1, wherein the barrier layer has a thickness less than a thickness of either the piezoelectric layer or the first electrode.

9. The acoustic resonator of claim 1, wherein the piezoelectric layer comprises:
   a piezoelectric portion disposed in the center portion; and
   a bending portion disposed in the extending portion, and extending in an incline from the piezoelectric portion along a contour of the insertion layer.

10. The acoustic resonator of claim 8, wherein at least a portion of the second electrode is disposed in the extending portion.

11. A method for manufacturing an acoustic resonator, the method comprising:
    forming a first electrode on a substrate;
    forming a barrier layer on the first electrode;
    forming an insertion layer by laminating the insertion layer directly on a portion of the barrier layer;
    forming a piezoelectric layer comprising a piezoelectric portion and a bending portion, wherein the piezoelectric portion is stacked on the barrier layer and the bending portion is stacked on the insertion layer; and
    forming a second electrode on the piezoelectric layer.

12. The method of claim 11, wherein the barrier layer is formed of a dielectric having a hexagonal close-packed (HCP) structure or a metal.

13. The method of claim 11, wherein the barrier layer is formed of titanium (Ti) or aluminum nitride (AlN).

14. The method of claim 13, wherein the first electrode is formed of molybdenum (Mo), and
    the piezoelectric layer is formed of aluminum nitride (AlN).

15. An acoustic resonator, comprising:
    a first electrode disposed on a substrate;
    a piezoelectric layer disposed on a portion of the first electrode, and comprising a bending portion extending from a piezoelectric portion;
    a second electrode disposed on a portion of the piezoelectric layer;
    an insertion layer disposed below the bending portion; and
    a barrier layer disposed between the first electrode and the piezoelectric layer, wherein the first electrode is disposed between the substrate and the second electrode, and the insertion layer is directly laminated on the barrier layer.

16. The acoustic resonator of claim 15, wherein a lower surface of the bending portion and an upper surface of the insertion layer have a same contour.

17. The method of claim 11, wherein the first electrode is disposed between the substrate and the second electrode.

* * * * *